(12) United States Patent
Granstrom et al.

(10) Patent No.: US 9,412,889 B2
(45) Date of Patent: Aug. 9, 2016

(54) ALIGNED NETWORKS ON SUBSTRATES

(71) Applicant: Cima NanoTech Israel Ltd., Industrial Park Caesarea (IL)

(72) Inventors: Eric L. Granstrom, Andover, MN (US); Arkady Garbar, Lakeville, MN (US); Ira Perelshtein-Elbaz, Or Akiva (IL); Ilana Haymov, Netanya (IL); Dov Zamir, Beerotaim (IL)

(73) Assignee: Cima NanoTech Israel Ltd., Industrial Park, Caesarea ( * ) Notice: Subject to any disclaimer, the term of this patent is extended or adjusted under 35 U.S.C. 154(b) by 76 days.

(21) Appl. No.: 14/354,306

(22) PCT Filed: Oct. 29, 2012

(86) PCT No.: PCT/IB2012/003039
§ 371 (c)(1),
(2) Date: Apr. 25, 2014

(87) PCT Pub. No.: WO2013/068853
PCT Pub. Date: May 16, 2013

(65) Prior Publication Data
US 2014/0290724 A1    Oct. 2, 2014

Related U.S. Application Data

(60) Provisional application No. 61/553,191, filed on Oct. 29, 2011.

(51) Int. Cl.
*H05K 1/00* (2006.01)
*H01L 31/0352* (2006.01)
(Continued)

(52) U.S. Cl.
CPC .......... *H01L 31/035272* (2013.01); *H01B 1/22* (2013.01); *H01L 31/18* (2013.01); *Y02E 10/50* (2013.01); *Y02P 70/521* (2015.11)

(58) Field of Classification Search
CPC ............. H05K 1/00; H05K 3/10; H05K 3/40; H05K 3/125; H01L 21/02; H01L 21/44; H01L 21/60; H01L 21/283; H01L 23/52; H01L 23/58; H01G 9/00
USPC .................... 174/250, 255, 394; 438/99, 660; 29/25.3, 846, 852
See application file for complete search history.

(56) References Cited

U.S. PATENT DOCUMENTS 5,476,535 A      12/1995   Khasin
5,508,348 A *    4/1996    Ruckenstein .......... H01B 1/127
                                                                252/500
(Continued)

FOREIGN PATENT DOCUMENTS

CN      102217088       10/2011
JP      2010-073415     4/2010
JP      2011-185687     9/2011

OTHER PUBLICATIONS

U.S. Appl. No. 14/354,321, filed Apr. 25, 2014, Granstrom et al.
(Continued)

*Primary Examiner* — Xiaoliang Chen
(74) *Attorney, Agent, or Firm* — Fish & Richardson P.C.

(57) ABSTRACT

Among other things, two networks, one on top of the other, are formed on a substrate based on coating materials containing emulsions or foams. The two networks can be formed of the same material, e.g., a conductive material such as silver, or can be formed of different materials. The coating materials forming the different networks can have different concentration of network materials.

10 Claims, 4 Drawing Sheets

(51) Int. Cl.
   *H01L 31/18* (2006.01)
   *H01B 1/22* (2006.01)

(56) References Cited

U.S. PATENT DOCUMENTS

| | | | | |
|---|---|---|---|---|
| 5,906,042 | A * | 5/1999 | Lan | H01L 23/5382 257/E23.171 |
| 5,972,052 | A * | 10/1999 | Kobayashi | H01G 9/15 29/25.03 |
| 6,519,161 | B1 * | 2/2003 | Green | B81B 7/0077 165/185 |
| 6,573,445 | B1 | 6/2003 | Burgers | |
| 7,544,229 | B2 | 6/2009 | Garbar et al. | |
| 7,566,360 | B2 | 7/2009 | Garbar et al. | |
| 7,601,406 | B2 | 10/2009 | Garbar et al. | |
| 7,932,186 | B2 | 4/2011 | Chang et al. | |
| 2002/0051950 | A1 * | 5/2002 | Katoh | G03C 1/22 430/592 |
| 2005/0215689 | A1 * | 9/2005 | Garbar | B82Y 30/00 524/440 |
| 2006/0162770 | A1 | 7/2006 | Matsui et al. | |
| 2007/0186971 | A1 | 8/2007 | Lochun et al. | |
| 2008/0193667 | A1 * | 8/2008 | Garbar | C09D 11/30 427/532 |
| 2008/0242083 | A1 * | 10/2008 | Yoshizumi | H01L 27/101 438/660 |
| 2009/0158890 | A1 * | 6/2009 | Garbar | B22F 1/0018 75/332 |
| 2009/0184637 | A1 * | 7/2009 | Yukinobu | H05B 33/22 313/509 |
| 2009/0317968 | A1 * | 12/2009 | Nagata | H01L 27/12 438/600 |
| 2010/0068409 | A1 * | 3/2010 | Garbar | C09D 11/322 427/532 |
| 2010/0200407 | A1 * | 8/2010 | Garbar | H05K 3/246 205/50 |
| 2010/0247810 | A1 * | 9/2010 | Yukinobu | H01B 1/08 428/1.4 |
| 2010/0275983 | A1 | 11/2010 | Kaes et al. | |
| 2011/0070404 | A1 * | 3/2011 | Naoi | G03C 1/853 428/156 |
| 2011/0175065 | A1 | 7/2011 | De La Vega et al. | |
| 2011/0193032 | A1 | 8/2011 | Shi | |
| 2011/0250387 | A1 | 10/2011 | Zagdoun et al. | |
| 2011/0273085 | A1 | 11/2011 | Garbar et al. | |
| 2012/0174392 | A1 * | 7/2012 | Shih | H05K 3/125 29/846 |
| 2012/0220497 | A1 * | 8/2012 | Jacobson | B01J 19/0046 506/16 |

OTHER PUBLICATIONS

U.S. Appl. No. 14/345,524, filed Mar. 18, 2014, Garbar et al.
U.S. Appl. No. 14/124,809, filed Apr. 3, 2014, Masrud et al.
International Search Report and Written Opinion in International Application No. PCT/IB2012/003039, mailed Jun. 21, 2013, 11 pages.
International Preliminary Report on Patentability in International Application No. PCT/IB2012/003039, mailed May 8, 2014, 6 pages.
Knauss et al., "Emitter Wrap Through Solar Cells using Electroless Plating Metallisation," University of Konstanz, Department of Physics, 2001, 4 pages.

* cited by examiner

ALIGNED NETWORKS ON SUBSTRATES

CROSS-REFERENCE TO RELATED APPLICATIONS

This application is a National Stage application under 35 U.S.C. 371 of International Application No. PCT/IB2012/003039, having an International Filing Date of Oct. 29, 2012, which claims priority to U.S. Provisional Application Ser. No. 61/553,191, filed on Oct. 29, 2011, the content of which is incorporated herein in its entirety.

TECHNICAL FIELD

This disclosure relates to aligned networks on substrates, particularly, two networks, one aligned with and on top of the other, formed on a substrate.

BACKGROUND

In the field of photovoltaics, high performance solar cell efficiency requires multiple and expensive processing steps to fabricate desired features in the solar cell. Such steps limit the utility of solar cells owing to added process costs.

In conventional solar cell designs, photogenerated current is driven to two electrodes: (1) a bottom (often continuous and uniform) electrode on a bottom side of the solar cell and (2) a fine printed array of wires on a front side (illuminated side) opposite to the bottom side. The fine printed array of wires on the front side of the solar cell can be formed by screen printing silver pastes into a fine pattern of lines.

Between the bottom electrode and the electrode on the front side, a conventional solar cell includes an emitter containing dopants in a semiconductive material. The emitter can be under the electrodes on the front side. Although the electrodes on the front side are patterned, in conventional solar cell designs, no such in-plane patterning is required for the dopants within the semiconductive material. A solar cell may contain regions of different doping varying through the depth of the cell from the bottom side to the front side. However, generally, within a plane perpendicular to the depth direction, dopants disperse uniformly.

SUMMARY

In one aspect, two networks, one on top of the other, are formed on a substrate based on coating materials containing emulsions or foams. The two networks can be formed of the same material, e.g., a conductive material such as silver, or can be formed of different materials. The coating materials forming the different networks can have different concentration of network materials. In some implementations, when both networks are formed of the same non-volatile materials, the network materials in different networks can have different concentrations. The second network on top of the first network can have a pattern that aligns with the pattern of the first network. In some implementations, the pattern of the second network registers or superimposes onto the pattern of the first network. The surface area of the second network can be substantially the same as the first network. In some implementations, the surface area of the first network is larger than that of the second network, or vice versa. The first and second networks can both be on a surface of the substrate. In some implementations, the first network is within the substrate, and the second network is on the surface of the substrate and on top of the first network.

The networks can be both random networks, regular networks, or one being relatively random and one being relatively regular. The discussion below uses random networks frequently. However, the networks may have regular spacing in some cases, particularly the first network. Regular networks are described in U.S. Provisional Application No. 61/495,582, the entire content of which is incorporated herein by reference. Accordingly, all or most of the features related to random networks can be replaced with regular networks.

The aligned first and second random networks can have various applications. For example, they can be used in solar cells. When the first and second random networks are both formed of a conductive material, the aligned networks can serve as electrodes on the front side of a solar cell and provide higher conductivity than electrodes containing a single network. When the first and second networks are formed of different materials, in some implementations, the first network is formed of a dopant material, e.g., doped silicon particles, to form an emitter on top of or within a solar cell substrate. The second network is formed of a conductive material for use as electrodes on the front side of the solar cell substrate.

In another aspect, the disclosure features an article comprising a substrate, a first self-assembled network on the substrate, and a second self-assembled network on the first self-assembled network. The first self-assembled network has traces and voids among the traces, and is formed from a first emulsion-based composition. The second self-assembled network is in direct contact with the first self-assembled network. The second self-assembled network also has traces and voids among the traces, and is formed from a second emulsion-based composition.

In another aspect, the disclosure features a method comprising applying a first emulsion-based coating composition on a substrate. The first emulsion-based coating composition self-assembles into a first self-assembled network comprising traces and voids among the traces. The method also comprises applying a second emulsion-based coating composition on the first self-assembled network. The second emulsion-based coating composition self-assembles into a second self-assembled network on the first self-assembled network. The second self-assembled network comprises traces and voids among the traces, and is directly in contact with the first self-assembled network.

The articles and methods of the disclosure may also include one or more of the following embodiments. The second self-assembled network aligns with the first self-assembled network. The first self-assembled network and the second self-assembled network have different compositions. The first self-assembled network has different components than the second self-assembled network. The first self-assembled network and the second self-assembled network comprise one or more same components, and the one or more components has different concentrations in the first self-assembled network and the second self-assembled network. The substrate comprises a silicon wafer, a polymeric film, or glass. At least one of the first and second self-assembled networks comprises conductive nanoparticles. At least one of the first and second self-assembled networks comprises glass fits. At least one of the first and second self-assembled networks comprises one or more dopants to the substrate. At least one of the first and second self-assembled networks is free of particles that are nano-sized or larger. The first self-assembled network comprises glass frit and the second self-assembled network comprises silver nanoparticles.

The articles and methods of the disclosure may also include one or more of the following embodiments. The first emulsion-based composition comprises glass frit and the second emulsion-based coating composition comprises silver nanoparticles. At least one of the first and second emulsion-based compositions is free of particles that are nano-sized or larger. The self-assembling into the second self-assembled network comprises aligns the second self-assembled network with the first self-assembled network. The second self-assembled network is conductive. The first and second emulsion-based compositions comprise one or more same components, and the one or more same components has different concentrations in the first and second emulsion-based compositions.

Other features, objects, and advantages will be apparent from the description and drawings.

DETAILED DESCRIPTION

There has been a desire to improve the performance of a solar cell over conventional designs by reducing the area of the printed electrodes on the front side of the solar cell and/or by reducing the (in-plane, where the plane being perpendicular to a depth direction of the solar cell) surface area of a doped region in the cell. Smaller areas of silver conductors on the front surface allow more light to enter the photoactive portions of the solar cell and improve efficiency. Doped regions having smaller areas further improve efficiency.

One way to achieve such improved performance is to use two patterning steps: a first step to locally dope selected areas of a solar cell substrate, and a second step to coat an electrode that is directly atop (e.g., superimposed on) and that aligns with the doped areas. In some implementations, silicon nanoparticles or other forms of dopants are doped into localized areas in a local doping step. Subsequently, a firing step is applied to render such dopants chemically or electrically active in the solar cell substrate. Electrodes on the front side and bottom side of the solar cell can be formed, and the electrodes on the front side can be patterned and fired.

In one example, the first and second steps in forming the dopants and patterned electrodes include use of printing two patterns on the front side of the solar cell. Such technologies have been developed by Innovalight (now DuPont). The printing process can be costly, and the details of aligning the first pattern to second pattern can lead to registration errors and associated performance or yield losses of the so-produced solar cells.

Typically, some degree of high temperature firing or processing is required to introduce the dopants. Such high temperature processing may be incompatible with the metal electrode technology used for the electrodes on the front side, thus maintaining an incentive to keep the two separate, but generally aligned, patterns processed with separate printing steps.

Figure 1:
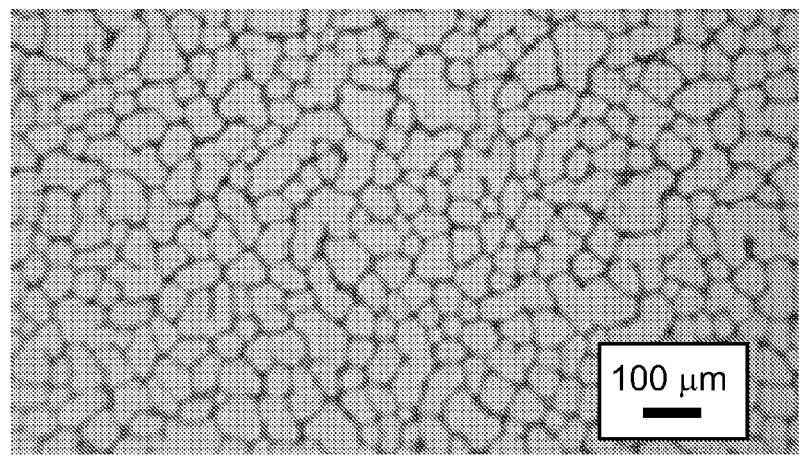
FIG. 1 is a micrograph of a random network on a surface of a substrate.

In some implementations, self-organizing properties of emulsions can be used advantageously to make useful patterns or networks on surfaces, including the fabrication of conductive meshes. Such random metal meshes may also be of use in photovoltaics cells. As an example, FIG. 1 shows a micrograph of such a metal mesh, where dark areas are silver traces and light areas are non-conductive, light-transmissive voids or pores among the traces. Random metal meshes are described in U.S. Pat. No. 7,601,406, and the use of such meshes in photovoltaic cells is described in U.S. Patent Application Publication No. 2011/0175065, the entire contents of both are incorporated herein by reference.

In some implementations, two aligned, e.g., registered or superimposed, random networks on top of each other are formed on a substrate, e.g., a solar cell substrate, based on emulsions. In particular, a first layer of patterned materials different from the substrate material and second layer of patterned materials containing a conductive network each can be formed based on emulsions. The first and second patterns (or networks) can be formed by self-assembly. For example, materials of the second layer can self-align directly on top of the first layer, thus forming two layers that are aligned, e.g., superimposed or registered. In some implementations, the first layer of patterned materials can be a priming network for the second network. The priming network can be a low-solid network that does not include any nanoparticles. For example, the priming network is formed of an emulsion that contains a small amount, e.g., 1-2 wt %, of non-volatile components, such as binders, adhesives, wetting agents, and rheology modifiers. In another example, the priming network is free of particles that are nano-sized or larger. Without wishing to be bound by the theories, the low-solid network can provide desirable surface energies to register the second layer of patterned materials.

The surface areas of the first and second patterns/networks can be substantially the same. For example, the second random network aligned with the first network substantially follows the pattern of the first random network. In some implementations, the surface area of the second pattern/network is greater than the surface area of the first pattern/network. For example, in addition to being on top of the first network, at least some materials of the second network collect along the sides of traces of the first network. In such implementations, the traces of the first network are widened by the materials of the second network, and the pores among the traces of the first network shrink by being partially filled. In some implementations, the second network is relatively thin on top of the first network and is relatively thick on the sides of traces of the first network. In other implementations the second network is located substantially all on the sides of traces of the first network.

Materials in the two layers can be the same, or may be different. An example of two layers having the same materials is a silver network on top of a silver network. Such an arrangement increases the conductivity of the silver networks. When the silver networks are used in a solar cell as electrodes on the front side of the solar cell, the percentage of transmission of visible light to the solar cell is reduced minimally by the networks. An example of two different materials is a first layer having a dopant and a second layer having silver, thus forming a conductive silver network superimposed on a dopant layer on, e.g., a semiconductor surface such as a silicon-based solar cell substrate. Materials other than silver can also be used in the first and/or second networks. In some implementations, the second layer is free of silver. In some examples, the second layer can include one or more dopants. In other implementations, the first layer can include glass frit.

A random network can be formed based on an emulsion and successively coated with a second layer nominally/primarily aligning selectively, such as directly registering atop the random network, with the areas defined by the random network. The second layer is formed based on the same or a different emulsion. The two layers may be formed of the same material, e.g., conductive metal nanoparticles, or they may contain different materials, e.g., a dopant layer followed by a conductive silver network. Further, if the two layers are formed of the same material, e.g., conductive silver, concentrations of the components, e.g., silver, in the emulsions may be different for different layers. The process and materials described may be used for enhancing the conductivity of a transparent, conductive silver network, or they may be used for solar cells having improved performance.

An emulsion drying process similar to that described in U.S. Pat. No. 7,601,406, the entire content of which is incorporated herein, can be used to form a random, interconnected network of doped silicon nanoparticles or other dopants on a surface of a substrate formed of material(s) different from the doping materials, e.g., a silicon wafer. Such dopant-sourcing materials can be used to introduce dopants in restricted and dispersed areas on the wafer surface with line widths of approximately 5-50 microns, and a front surface coverage of 1-10%. Subsequently, a second coating process can be used to self-align a second layer of material to the formed dopant layer. In some embodiments, the second coating process includes applying an emulsion to the dopant layer and materials in the emulsion self-assemble to decorate the formed dopant pattern. With two wet process steps (neither requiring printing or mechanical contact to the substrate), both dopant and silver electrode layers can be formed with geometrically useful shapes based on a low-cost and high-efficiency coating process, e.g., solar cell formation process. Use of emulsions that self-assemble to decorate differences in surfaces (based on surface energy, topology, and etc.) is also described in U.S. Provisional Application No. 61/495,582 (filed on Jun. 10, 2011), and U.S. Published Patent Application No. 2011/0175065, the entire contents of which are incorporated herein by reference.

The substrates on which aligned random networks are formed, the coating materials used for the random networks, and the processes of applying the coating materials and forming the random networks can have the following features.

Substrates—A variety of unpatterned substrates can be used. If the objective is to prepare an article having a transparent, conductive coating, the substrate preferably is substantially transparent to light in the visible region (400-800 nm). Examples of suitable substrates include glass, polymeric materials (e.g., polymethylmethacrylate, polyethylene, polyethylene terephthalate, polypropylene, or polycarbonate), ceramics (e.g., transparent metal oxides), and semiconductive materials (e.g., silicon or germanium). The substrate may be used as is or pre-treated to alter its surface properties. For example, the substrate may be pre-treated to improve adhesion between the coating and the substrate surface, or to increase or control the surface energy of the substrate. Both physical and chemical pre-treatments can be used. Examples of physical pre-treatments include corona, plasma, ultraviolet, thermal, or flame treatment. Examples of chemical pre-treatments include etchants (e.g., acid etchants), primers, anti-reflection coatings, or hard-coat layers (e.g., to provide scratch-resistance). In particular, the substrate can be a substrate, e.g., a semiconductive substrate, containing photovoltaic cell.

The substrates can also be patterned substrates. For example, the unpatterned substrates can be patterned before the transparent, conductive coating applied to the substrates. In some implementations, a semiconductive substrate can be patterned to form through holes, e.g., using laser drilling or etching. In some implementations, the aligned, e.g., superimposed or registered, random networks can be formed on the substrates containing through holes as described in U.S. Ser. No. 61/553,192, filed on the same day as the present patent application and the entire content of which is incorporated herein by reference. The second random network on top of the first random network can be a conductive random network that is modified by the through hole patterns and forms features similar to the conductive network described in U.S. Ser. No. 61/553,192. For example, in addition to those materials aligning with, e.g., superimposing or registering, the first random network, materials in the second pattern may reach into the through holes. In some implementations, the substrates may be patterned before formation of the first and second aligned random networks. In other implementations, the substrates may be patterned after formation of the first random network and before formation of the second random network on the first random network.

Coating materials—Suitable coating materials for use can include a non-volatile component and a liquid carrier. The liquid carrier is in the form of an emulsion having a continuous phase and domains dispersed in the continuous phase.

Examples of suitable non-volatile components include metal and ceramic nanoparticles. The nanoparticles preferably have a $D_{90}$ value less than about 100 nanometers. Specific examples include metal nanoparticles prepared according to the process described in U.S. Pat. No. 5,476,535 and U.S. Pat. No. 7,544,229, both of which are incorporated by reference in their entirety. As described in these two patents, the nanoparticles are generally prepared by forming an alloy between two metals; such as an alloy between silver and aluminum, leaching one of the metals, such as the aluminum, using a basic or acidic leaching agent to form a porous metal agglomerate; and then disintegrating the agglomerate (e.g., using a mechanical disperser, a mechanical homogenizer, an ultrasonic homogenizer, or a milling device) to form nanoparticles. The nanoparticles may be coated prior to disintegration to inhibit agglomeration. In some implementations, the particles can be larger than nano-sized. Materials for nano-sized or larger particles can also include glass frit, which can be useful for burning through passivation layers on semiconductor wafers, e.g. a silicon nitride layer on a silicon wafer, thus establishing electrical contact with the underlying semiconductor.

Examples of useful metals for making the nanoparticles include silver, gold, platinum, palladium, nickel, cobalt, copper, titanium, iridium, aluminum, zinc, magnesium, tin, and combinations thereof. Examples of useful materials for coating the nanoparticles to inhibit agglomeration include sorbitan esters, polyoxyethylene esters, alcohols, glycerin, polyglycols, organic acid, organic acid salts, organic acid esters, thiols, phosphines, low molecular weight polymers, and combinations thereof.

Useful nanoparticles for doping may partially diffuse into the semiconductor layer. Aluminum is an example of a suitable dopant for use in the coating material. Other suitable dopant can include boron, phosphorus, arsenic, and gallium.

The concentration of the non-volatile component (e.g., nanoparticles) in the liquid carrier generally ranges from about 1-50 wt %, preferably 1-10 wt %. The specific amount is selected to yield a composition that may be coated on the substrate surface. When an electrically conductive coating is desired, the amount is selected to yield an appropriate level of conductivity in the dried coating.

The liquid carrier is in the form of an emulsion featuring a continuous phase and domains dispersed in the continuous phase. In some implementations, the emulsion is a water-in-oil (W/O) emulsion in which one or more organic liquids form the continuous phase and one or more aqueous liquids form the dispersed domains. In other implementations, the emulsion is an oil-in-water (O/W) emulsion in which one or more aqueous liquids form the continuous phase and one or more organic liquids form the dispersed domains. In both cases, the aqueous and organic liquids are substantially immiscible in each other such that two distinct phases are formed.

Examples of suitable aqueous liquids for either a W/O or O/W emulsion include water, methanol, ethanol, ethylene glycol, glycerol, dimethyformamide, dimethylacetamide, acetonitrile, dimethylsulfoxide, N-methylpyrrolidone, and combinations thereof. Examples of suitable organic liquids for either a W/O or O/W emulsion include petroleum ether, hexanes, heptanes, toluene, benzene, dichloroethane, trichloroethylene, chloroform, dichloromethane, nitromethane, dibromomethane, cyclopentanone, cyclohexanone, and combinations thereof. Solvents should be selected so that the solvent of the continuous phase of the emulsion evaporates faster than the solvent of the dispersed domains. For example, in some implementations, the emulsion is a W/O emulsion where the organic liquid evaporates more quickly than the aqueous liquid.

The liquid carrier may also contain other additives. Specific examples include reactive or non-reactive diluents, oxygen scavengers, hard coat components, inhibitors, stabilizers, colorants, pigments, IR absorbers, surfactants, wetting agents, leveling agents, flow control agents, rheology modifiers, slip agents, dispersion aids, defoamers, binders, adhesion promoters, corrosion inhibitors, and combinations thereof.

In some embodiments, although the coating materials are described as emulsion-based, the coating material can be a foam based material. For example, the coating material can have a nonvolatile element in a liquid phase intermixed with a gas, such as in the form of a foam. In a preferred embodiment, the nonvolatile element is metal nanoparticles. The metal particles may be dispersed in a water based liquid dispersion and mixed with air to form a foam. In some embodiments, such a dispersion is aqueous and there is no need for immiscible organic solvents and an emulsion. Such a coating material is described in U.S. Patent Application Publication No. 2011/0193032, the entire content of which is incorporated herein by reference.

Process—Suitable coating processes can include screen-printing, manual applicator and manual spreading. Other suitable techniques such as spin coating, mayer rod coating, gravure coating, microgravure coating, curtain coating, spray coating, ink jet printing, offset printing and any suitable technique can also be used. After the coating material is applied, the solvent is evaporated from the emulsion, with or without the application of temperatures above ambient. Preferably, the remaining coating is sintered at a temperature within the range of about room temperature to about 850° C. Sintering preferably takes place at ambient atmospheric pressure.

Alternatively or additionally, all or part of the sintering process can take place in the presence of a chemical that induces the sintering process. Examples of suitable chemicals include formaldehyde or acids, such as formic acid, acetic acid, and hydrochloric acid. The chemical may be in the form of a vapor or a liquid to which the deposited particles are exposed. Alternatively, such chemicals may be incorporated into the composition comprising the nanoparticles prior to deposition, or may be deposited on the nanoparticles after depositing the particles on the substrate.

The process may also include a post-sintering treatment step, in which the formed conductive layer may be further sintered, annealed, or otherwise post-treated using thermal, laser, UV, acid or other treatments and/or exposure to chemicals such as metal salts, bases, or ionic liquids. The treated conductive layer may be washed with water or other chemical wash solutions such as acid solution, acetone, or other suitable liquids. Post-treatment of the coating can be performed by batch process equipment or continuous coating equipment, on small laboratory scales or on larger industrial scales, including roll-to-roll processes.

Suitable substrates, coating materials, and processes, and self-assembling processes are also described in U.S. patent application Ser. No. 12/809,195 (filed on Jul. 26, 2011), U.S. Provisional Application No. 61/495,582 (filed on Jun. 10, 2011), and U.S. Pat. No. 7,566,360, the entire contents of which are incorporated herein by reference.

In some implementations, the pattern and alignment of the first and second random networks may be modified. For instance, a mask of material may be placed or deposited on a substrate surface where the discontinuous areas of a dried emulsion network are to be formed. Here a mask can be used to allow gas, vapor implantation, or plasma phase introduction of dopants into the underlying wafer in the selected areas not covered by the mask. A second process with or without the mask may be used to coat a metal (e.g., forming a conductive silver network) preferentially on top of the doped area.

Alternatively, an etch process may be used to remove materials and form networks in desired patterns. For example, etching can be used in the first step of forming the conductive network based on an emulsion. Patterning a network is also described in U.S. Provisional Application No. 61/536,122, filed on Sep. 19, 2011, the entire content of which is incorporated herein by reference.

Although aligned first and second networks are described, the second network can have traces randomly distributed across the first network without aligning with traces of the first network. Furthermore, the aligned first and second networks may include some parts that are not perfectly registered or superimposed on each other. In some implementations, the aligned first and second networks include one or more portions of the second network having traces randomly distributed across respective one or more portions of the first network without aligning with traces of the first network in the one or more portions.

In general, a firing step may be used between the two process steps of forming the two aligned, e.g., superimposed or registered, random networks, e.g., forming a solar cell device. A second annealing or firing step may also be used after the second step to sinter the second random network, e.g., a metal network.

Though reference is made above to use on silicon based photovoltaics applications, the benefit of self-registered patterns of two materials in subsequent steps is noted for other applications, such as in other photovoltaics (e.g., thin film photovoltaics) applications, and electronics applications more generally. For example, a similar emulsion drying process can be used. Two layers containing different materials can be generated with preferred alignment on top of each other, without requiring additional patterning elements.

EXAMPLES

Example 1

The non-primer treated side of a 4 mil Mitsubishi E100 PET substrate (Mitsubishi Polyester Film, Mitsubishi, Japan) was used after having been treated with 2 kW corona as delivered by a TS Tech (Cheonan, Korea) Corona treatment system, the web was processed through the corona at 10 m/min.

A dispersion having compositions as shown in Table 1 (quantities in grams) was mixed by sonication for 30 seconds at 40 W using a Misonix 3000 sonicating mixer in a beaker.

TABLE 1

| | |
|---|---|
| BYK 410(rheological agent including a modified urea, BYK-Chemie GmbH, Wesel, Germany) | 0.077 |
| Span 60(sorbitan monooctadecanoate, Sigma-Aldrich Co., St. Louis, MO) | 0.063 |
| Silver powder P204(Cima NanoTech, Inc., Caesarea, Israel) | 2.022 |
| Cyclohexanone (Sigma-Aldrich Co.) | 2.289 |
| Toluene(VWR Industries, Batavia, Illinois) | 25.268 |
| UV adhesives PL-803B (a UV acrylate and non-amine initiators adhesive system, Palermo Lundahl Industries (Chisago City, MN)) | 0.624 |

To that dispersion, the following materials in Table 2 were added (quantities in grams), and the entire mixture was sonicated again twice for 30 seconds each, at 40 W, using a Mixonix 3000 sonicating mixer.

TABLE 2

| | |
|---|---|
| 0.02% BYK 348 solution in water (Byk 348, a polyether modified siloxane wetting agent, being supplied by BYK-Chemie GmbH, Wesel, Germany) | 18.991 |
| Aniline(Fluka, St. Gallen Switzerland) | 0.037 |
| 2-Amino-1-Butanol (Sigma Aldrich Co.) | 0.065 |
| 5% Q4-3667 solution in Toluene (Dow Corning, Midland, Michigan) | 0.295 |
| 5% Ethyl Cellulose solution in Toluene (Sigma Aldrich) | 0.354 |
| 1% SYNPERONIC NP30 in Toluene (a polyethyleneglycol nonylphenyl ether, Fluka, Gillingham, England) | 0.215 |

The emulsion was applied in excess by pipette to a (PET) substrate having dimensions of approximately 4"×4", and was drawn down by a Mayer rod to provide nominally 24 microns of wet thickness. The applied emulsion is then dried in a 50° C. oven for 1 minute immediately after coating and is subjected to UV curing using a Fusion UV System F300S for one pass at 15 feet per minute.

Subsequently, a second layer of the same emulsion was applied to only a portion of the already-coated and dried substrate with identical steps except that a nominal 30 microns of wet thickness is provided by the Mayer rod.

Figure 2:
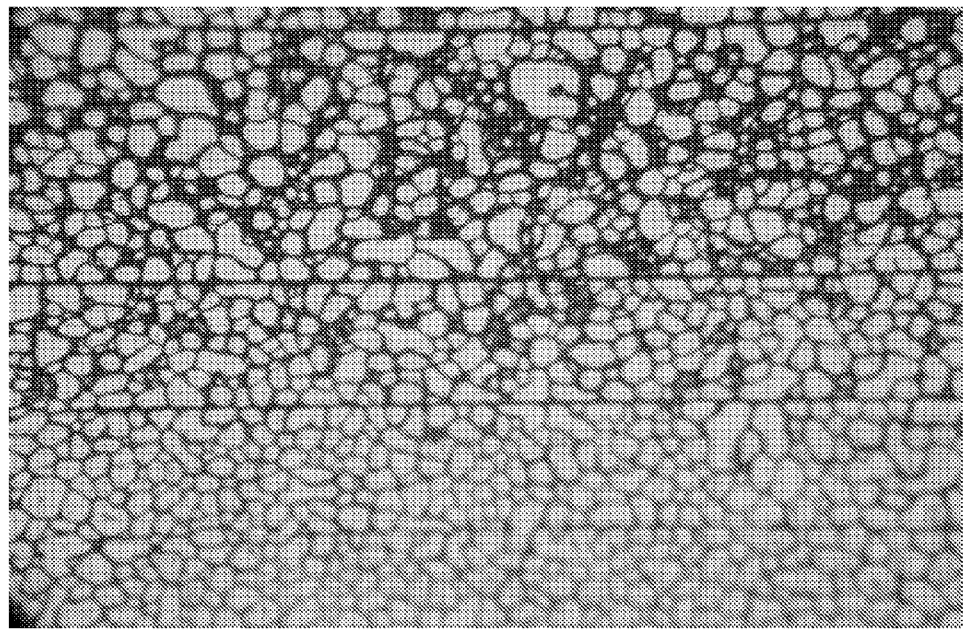
FIGS. 2-5 are micrographs of surfaces of substrates on which a single random network, two aligned random networks, or overlapping single and double random networks are formed.

FIG. 2 shows a micrograph of the resulting film. Light areas are voids, while dark areas are the conductive silver network. The dark horizontal lines are artifacts caused by the Mayer rod. The lower half of the micrograph shows the portion of the film formed only based on the first layer of the emulsion. The upper half of the micrograph shows the portion of the film formed based on both layers of the emulsion. The silver network in the upper half of the micrograph is darker, indicating that a heavier coating of silver is present. There is approximately the same number of voids (e.g., cells) having the same sizes or similar sizes in both halves of the micrograph, indicating that the second layer is aligned with the first layer.

Example 2

The substrate described in Example 1 was used. To form a first layer, an emulsion similar to that described in Example 1 was used. However, only 0.29 g of P204 silver powder was used. To form a second layer, an emulsion having an identical composition to that described in Example 1 was used. Thus, the first layer of emulsion had a total solids content of 2.2 wt % (0.6 wt % silver), while the second layer had a total solids content of 5.6 wt % (4.0 wt % silver). All other elements, e.g., coating processes, of Example 1 were replicated. As in Example 1, the first layer was coated on the entire film substrate, while the second was only coated on a portion of the first layer.

Figure 3:
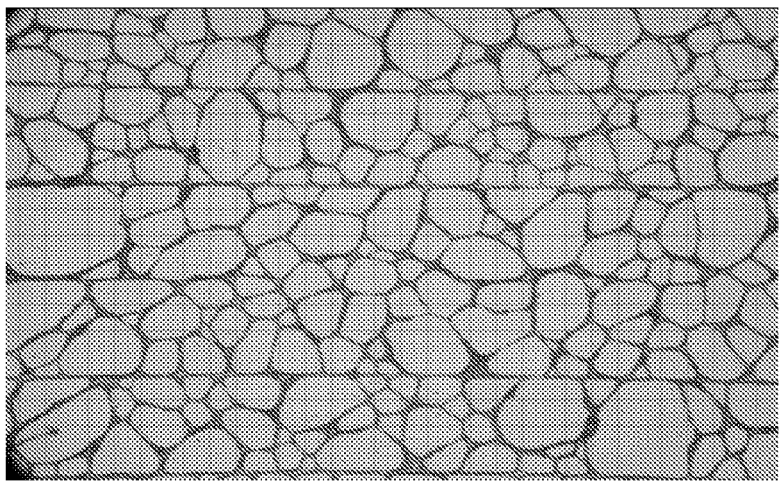
Figure 4:
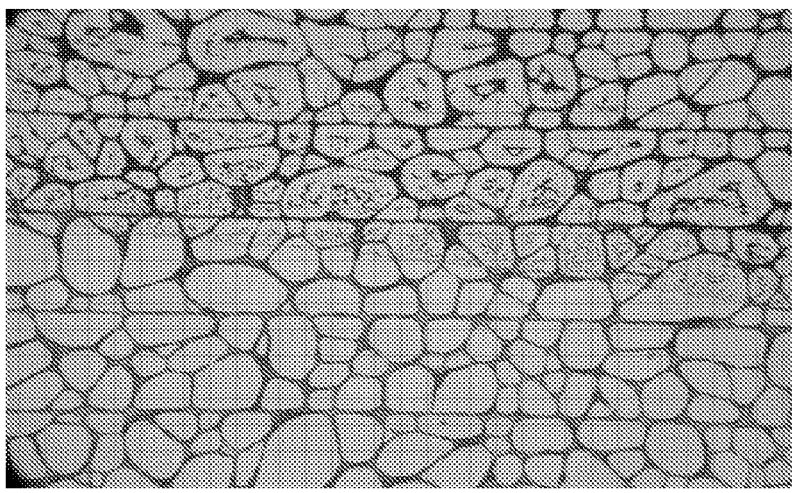
Figure 5:
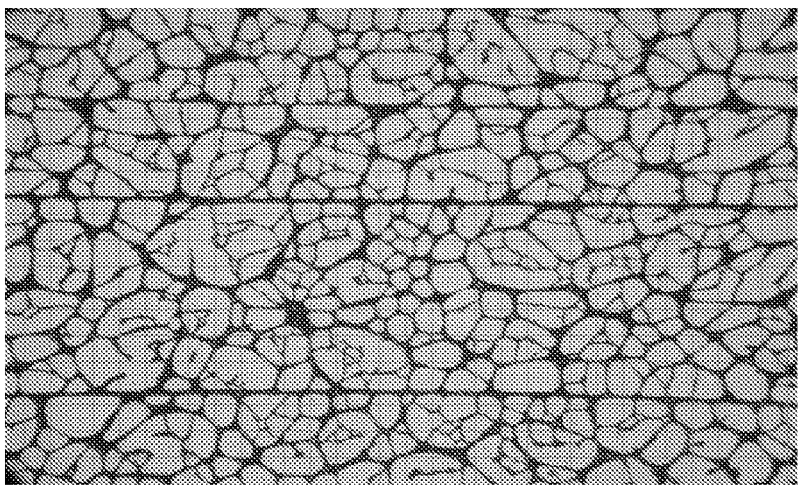

FIGS. 3-5 show micrographs of the resulting films. FIG. 3 shows the portion of the film having the first layer only. FIG. 4 shows an overlapping region of the film that shows the overlap between the first and the second layers. FIG. 5 shows the portion of the film having both layers. The silver traces in the single layer portion are lighter in color than the traces in the two-layer coating, indicating that the network produced by the second coating step aligned on top of the first coating, producing aligned, e.g., superimposed or registered, traces having a larger amount of silver than a single trace. The cells (or voids) separated by the traces and in the two-layer portion have a small amount of silver present either as spots or as traces.

Example 3

A silicon wafer having a silicon nitride passivation layer (available from Jiangsu Green Power PV Co., Ltd., China) was treated with a 100% air plasma for 1 minute in a Nano Low Pressure Plasma System (available from Diener Electronic, Reading, Pa.). A first emulsion-based coating composition was mixed by assembling all the components listed in Table 3, except for WS001, and ultrasonically mixing, for about 30 seconds, the assembled components until they are uniform. Then the WS001 (i.e. the aqueous portion) was added and the emulsion-based coating composition was ultrasonically mixed for 30 seconds, physically agitated, and then ultrasonically mixed an additional 30 seconds. This emulsion-based coating composition was coated onto the treated side of the silicon wafer using a Mayer rod to produce a wet coating thickness of about 4 microns to about 6 microns. The wet coating was allowed to dry at room temperature for about 30-60 seconds, until it was visually dry, which produced a first coating layer. Next, a second emulsion-based coating composition having the components listed in Table 3 was ultrasonically mixed in the same manner as the first emulsion-based coating composition. The second emulsion-based coating composition was coated onto the first coating layer using a Mayer rod to produce a wet coating thickness of about 30 microns. The second coating was allowed to dry at room temperature for about 60 seconds, then was sintered in an oven at about 250° C. for about 30 minutes. As a result, a random network of cells and conductive traces was formed, e.g., similar to the network shown in FIG. 1.

A similar plasma-treated silicon wafer was coated with the second emulsion-based coating composition without the first emulsion-based coating composition. No network formation occurred.

TABLE 3

| Components | Example 3, First Emulsion-based Coating Composition (Wt %) | Example 3, Second Emulsion-based Coating Composition (Wt %) | Example 4, First Emulsion-based Coating (Wt %) | Example 4, Second Emulsion-based Coating (Wt %) |
|---|---|---|---|---|
| Aniline | 0.13 | 0.12 | 0.07 | 0.07 |
| 2-amino-1-butanol | 0.25 | 0.24 | 0.15 | 0.14 |
| 5% EN 1540 in toluene (Polyoxyethylene Oleyl Ether (EO: 40 moles), available under the name Blaunon EN 1540, Aoki Oil Industrial Co., Osaka, Japan) | 0.25 | 0.24 | 0 | 0 |
| 5% Q4-3667 in toluene | 0.42 | 0.40 | 0.42 | 0.40 |
| 5% Ethyl Cellulose in toluene | 1.02 | 0.98 | 1.03 | 0.98 |
| 5% Synperonic NP30 in toluene | 0 | 0 | 0.23 | 0.22 |
| 10% BYK 2025 in toluene (a high molecular weight structured acrylate copolymer available under the name Disperbyk 2025, BYK USA, Wallingford, CT) | 0.08 | 0.08 | 0 | 0 |
| Cymel 303 (Hexamethoxymethyl melamine, Cytec Industries, Woodland Park, NJ) | 0 | 0 | 0.12 | 0.12 |
| Kflex 307 (Linear, saturated, aliphatic polyester diol with primary hydroxyl groups, King Industries, Norwalk, CT) | 0 | 0 | 0.25 | 0.25 |
| Nacure 2501 (Amine blocked toluenesulfonic acid, King Industries, Norwalk, CT) | 0 | 0 | 0.24 | 0.24 |
| BYK 410 | 0.16 | 0.16 | 0.15 | 0.14 |
| Span 60 | 0.14 | 0.13 | 0.14 | 0.13 |
| Cyclohexanone | 4.81 | 4.60 | 4.76 | 4.63 |
| Toluene | 53.14 | 50.74 | 52.93 | 50.80 |
| Silver powder P204 | 0 | 4.05 | 0 | 4.06 |
| Glass frit (available as EBC 2027 by EBC Trading Co., Brownstone, PA, having the particle size reduced to about 300 nanometers and added as a dispersion of 4.8% BYK 2025, 40% glass frit, and 55.2% toluene) | 0 | 0.49 | 0 | 0 |
| WS001 (0.02 wt % of BYK 348 in deionized water, BYK USA) | 39.60 | 37.79 | 39.50 | 37.82 |

Example 4

A PET substrate (SH-34 available under the trade name Skyrol by SKC Inc., South Korea) was pre-treated by passing through a UV processor (Fusion UV System F300 with H type lamp, Fusion UV Systems Inc., Gaithersburg, Md.) at a speed of about 5.5 meters/min. Components of a first emulsion-based coating composition and a second emulsion-based coating composition are listed in Table 3. The emulsion-based coating compositions were prepared and mixed using the same method as described in Example 3. The first emulsion-based coating composition was coated onto the treated substrate to form a wet coating having a thickness of about 30 microns, using a coating speed of 11 meters/minute (K Control Coater Model 202, R K Print-Coat Instruments Ltd., UK). The coated substrate was then dried at room temperature for about 1 minute and a first coating layer was formed on the substrate. The second emulsion-based coating composition was coated onto the first coating layer to form a second coating layer, under similar conditions to those used in forming the first coating layer.

Figure 7A:
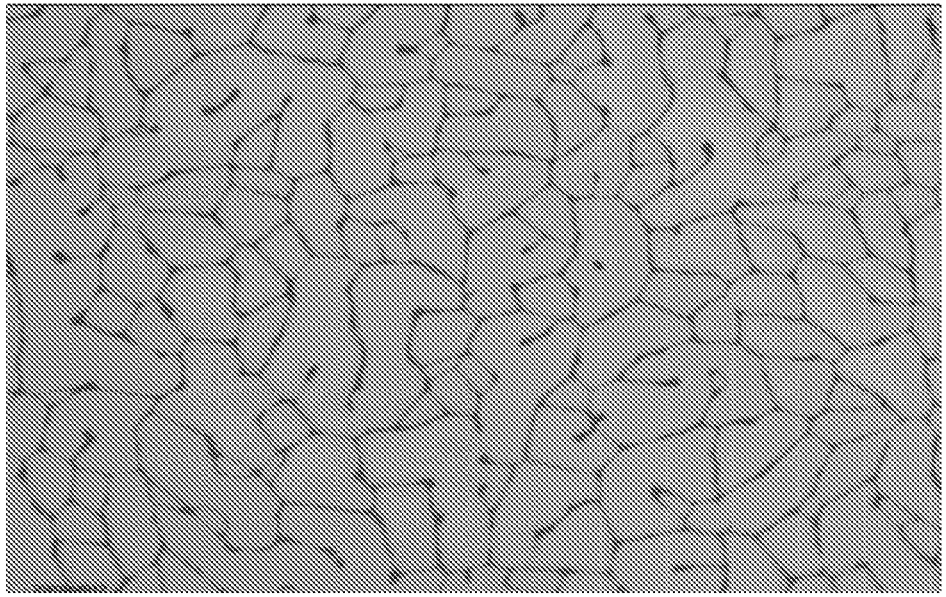
FIG. 7A is a micrograph of a surface area of a substrate on which a single random network is formed.
Figure 7B:
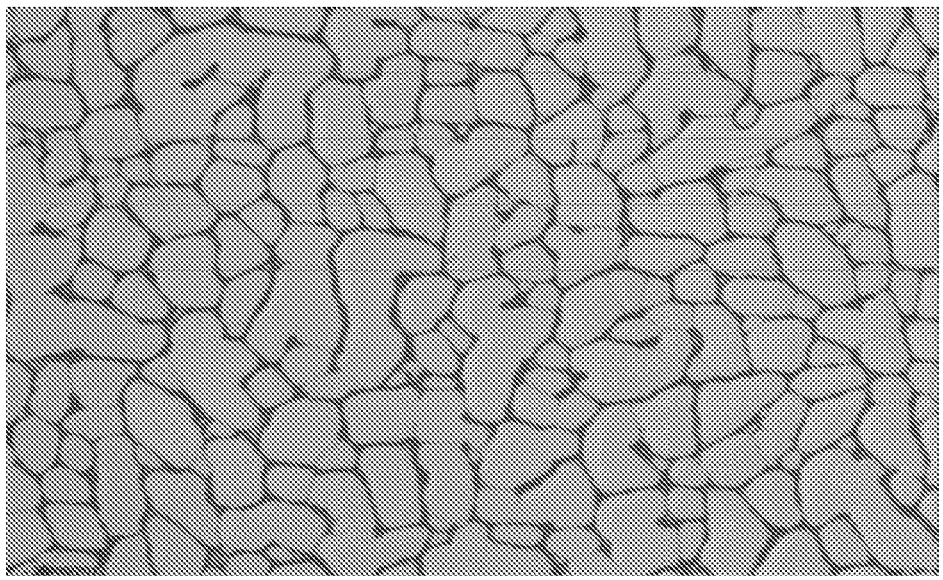
FIG. 7B is a micrograph of the surface area of FIG. 7A, with an additional second random network formed on top of the single random network.

Results are shown in FIGS. 7A and 7B. In particular, FIG. 7A is a micrograph (10× magnification) showing an area of the substrate having only the first coating layer, and FIG. 7B is a micrograph showing the same area having both the first and second coating layers. It can be seen that the cells and traces in both figures are identical in sizes and shapes, indicating that the silver nanoparticle of the second coating layer self-assembled conforming to the traces formed of the first coating layer.

Figure 6A:
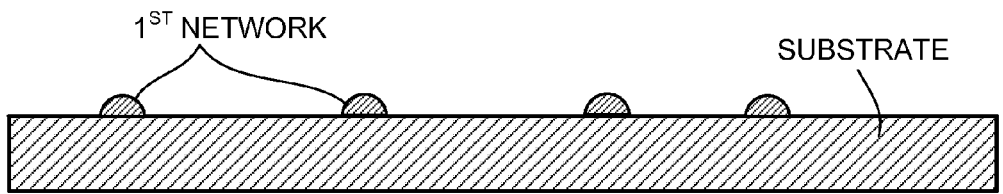
FIG. 6A is a schematic view of a random network on a substrate.

Referring to FIG. 6A, a first network, e.g., a random network, of mesh is formed on a substrate. In some implementations, the first network contains silver or other materials and the substrate is a PET substrate. In other embodiments, the substrate is a silicon-based substrate and the first network contains dopants to the silicon-based substrate.

Figure 6B:
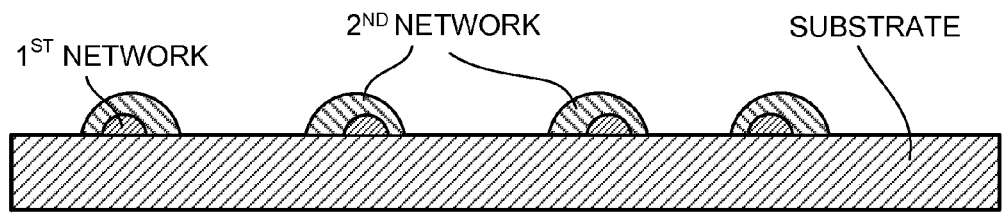
FIGS. 6B-6E are schematic views of two aligned random networks on substrates.
Figure 6C:
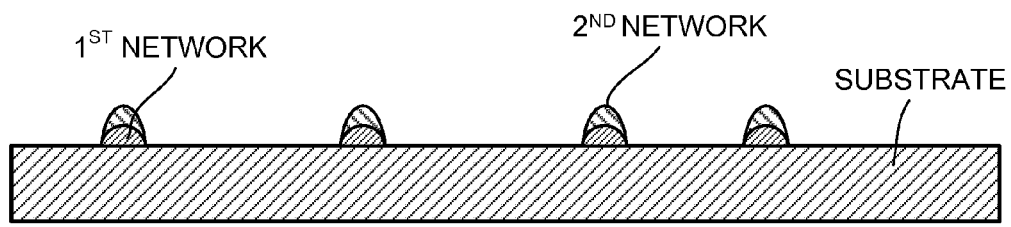
Figure 6D:
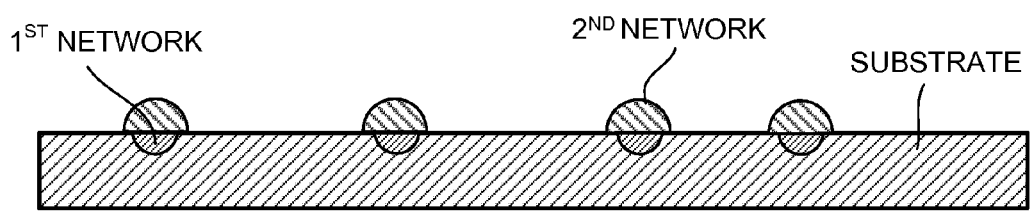
Figure 6E:
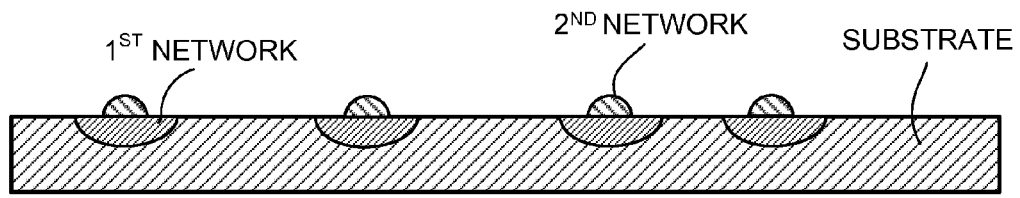

Referring to FIGS. 6B-6E, a second network, e.g., another random network, is self-assembled on the first network and aligns, e.g., superimposes onto, the first network. Referring in particular to FIG. 6B, materials in the second network substantially follows the pattern of the first network and overhang materials of the first network. At least some of the materials in the second network collect on the sides of the first network. In some implementations, the first and second networks are formed of the same material, e.g., silver, on a PET substrate. When used as electrodes, the greater amount silver material provided by both layers can provide high conductivity. Although not shown in this figure, materials of the second network can be located only on the sides of the first network, without covering traces of the first network. Referring now to FIG. 6C, the second layer is self-arranged atop the first layer and has a smaller area than first layer. Referring to FIG. 6D, the second network has similar features to the features shown in FIG. 6B, except that the first network is burnt, fired, or sintered into the substrate instead of being on top of the substrate. For example, when the first network contains dopants on a silicon wafer, the dopants are within the silicon wafer. The second network can be a silver network. Referring to FIG. 6E, the second network has similar features to those shown in FIG. 6C, except that the first network is burnt, fired, or sintered into the substrate and has a much wider area in the surface of the substrate than the first network. When used in a solar cell, the first network can contain dopants formed in a silicon-based substrate, and the second network can be a silver network.

The invention claimed is:

1. An article comprising:
    a substrate;
    a first network on the substrate, the first network having interconnected traces defining randomly shaped voids and being formed from a first emulsion-based composition; and
    a second network on the first network and in direct contact with the first network, the second network having interconnected traces defining randomly shaped voids and being formed from a second emulsion-based composition.

2. The article of claim 1, wherein the second network aligns with the first network.

3. The article of claim 1, wherein the first network and the second network have different compositions.

4. The article of claim 1, wherein the first network has different components than the second network.

5. The article of claim 1, wherein the first network and the second network comprise one or more same components, and wherein the one or more components has different concentrations in the first network and the second network.

6. The article of claim 1, wherein the substrate comprises a silicon wafer, a polymeric film, or glass.

7. The article of claim 1, wherein at least one of the first and second networks comprises conductive nanoparticles.

8. The article of claim 1, wherein at least one of the first and second networks comprises glass frits.

9. The article of claim 1, wherein at least one of the first and second networks comprises one or more dopants to the substrate.

10. The article of claim 1, wherein the first network comprises glass frit and the second network comprises silver nanoparticles.

* * * * *